United States Patent [19]

Matthies

[11] Patent Number: 4,779,061

[45] Date of Patent: Oct. 18, 1988

[54] CURRENT-MIRROR ARRANGEMENT

[75] Inventor: Karl-Heinz Matthies, Hamburg, Fed. Rep. of Germany

[73] Assignee: U.S. Philips Corporation, New York, N.Y.

[21] Appl. No.: 10,219

[22] Filed: Feb. 3, 1987

[30] Foreign Application Priority Data

Feb. 7, 1986 [DE] Fed. Rep. of Germany ....... 3603799

[51] Int. Cl.[4] ............................................. H03F 3/04
[52] U.S. Cl. .................................... 330/288; 323/316
[58] Field of Search ................ 330/257, 288; 323/315, 323/316

[56] References Cited

U.S. PATENT DOCUMENTS 4,525,682 6/1985 Lai et al. ......................... 323/315 X

FOREIGN PATENT DOCUMENTS 2642874 3/1977 Fed. Rep. of Germany ...... 330/288

OTHER PUBLICATIONS

*IBM Technical Disclosure Bulletin,* vol. 28, No. 3, Aug. 1985, pp. 1186–1187.

*Primary Examiner*—James B. Mullins
*Attorney, Agent, or Firm*—Thomas A. Briody; David R. Treacy; Bernard Franzblau

[57] ABSTRACT

A current-mirror arrangement comprising a first and a second transistor (3, 4). The base and the collector of the first PNP transistor (3) and the base of the second PNP transistor are all coupled to a junction point (1) to receive an input current (Ye). The output current (Ya) is available at the collector of the second PNP transistor (4). The arrangement comprises a compensation circuit (2) which supplies a compensation current to the junction point (1) which is substantially equal to the sum of the base currents of the first and second transistors.

19 Claims, 1 Drawing Sheet

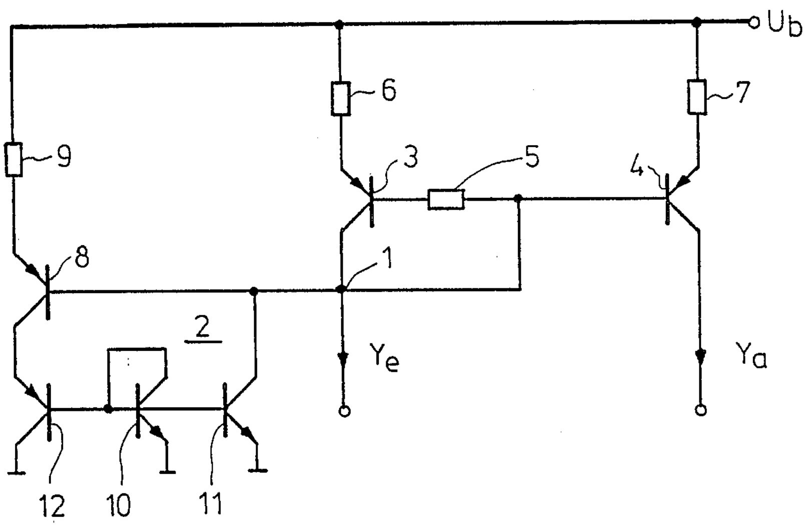
Ub
6
7
9
3
5
4
8
1
2
Ye
Ya
12
10
11

CURRENT-MIRROR ARRANGEMENT

BACKGROUND OF THE INVENTION

This invention relates to a current-mirror arrangement comprising a first transistor whose emitter is coupled to a voltage source and whose collector and base are coupled to a junction point for the application of an input current, and at least a second transistor whose emitter is coupled to the voltage source, whose base is coupled to the base of the first transistor, and whose collector constitutes the output for supplying an output current.

Such a current-mirror arrangement is known, for example from the book by Jovan Antula, "Schaltungen zur Mikroelektronik", Oldenbourg-Verlag, 1984, pages 56 to 59. The function of a current-mirror arrangement is to generate an output current which is in a fixed ratio to the input current. As is known, a current-mirror arrangement has a low input resistance and a high output resistance. Under load the output current therefore changes only to a very small extent. Further, such an arrangement is largely independent of temperature influences.

In the known arrangement the input current is substantially equal to the output current for high d.c. gain factors. The symmetry error of the current-mirror arrangement, which is caused by the base currents of the two transistors, is almost negligible for high d.c. gain factors.

Current-mirror arrangements are mainly used in integrated circuits. The following problem may then occur when PNP transistors are used. The current gain depends essentially on the emitter area of a PNP transistor. A change in emitter area means a change in current gain. In the fabrication of integrated circuits which comprise at least one current-mirror arrangement formed with PNP transistors, the spread between devices may be such that symmetry errors are no longer negligible.

SUMMARY OF THE INVENTION

It is the object of the invention to construct a circuit arrangement of the type defined in the opening paragraph in such a way that symmetry errors are reduced.

This object is achieved in that a compensation circuit comprising further transistors supplies a compensation current to the junction point, which current essentially corresponds to the sum of the base currents of the first transistor and the second transistor.

In the circuit arrangement in accordance with the invention the compensation circuit provides compensation for the symmetry error caused by the base currents of the two current-mirror transistors.

It is to be noted that U.S. Pat. No. 3,916,331 describes a compensation circuit for an input transistor which receives an input signal on its base and transfers this signal to a differential amplifier stage. Compensation for the base current of the input transistor is then provided by a compensation current derived from the current from its collector. This is done to increase the input resistance of the circuit arrangement.

In a first embodiment of the invention the emitter of the first transistor is coupled to the voltage source via a first resistor and the emitter of the second transistor is coupled to said voltage source via a second resistor of substantially the same value as the first resistor. The first resistor and the second resistor ensure that different base-emitter voltages of the two current-mirror transistors caused by tolerance spreads do not affect the correct operation of the current-mirror arrangement.

In order to improve the dynamic performance of the current-mirror arrangement a third resistor is arranged between the base of the first transistor and the junction point. This third resistor enables pulses to be transmitted by the current-mirror arrangement substantially without any distortion. The third resistor should then have substantially the same value as the first resistor.

In another embodiment of the invention the first and the second transistor are both PNP transistors and the compensation current generated by the compensation circuit, which comprises further PNP transistors, depends on the emitter areas of the PNP transistors in the compensation circuit in the same way as the sum of the base currents of the first and the second transistor depends on their emitter areas.

The compensation circuit generates a compensation current whose magnitude depends on the emitter areas of the PNP transistors employed in the compensation circuit. The spread in emitter area between different devices occurring in the fabrication of integrated circuits results in a different d.c. gain because the d.c. gain depends on the emitter area of a transistor. However, the ratio between the emitter areas of the various transistors in the integrated circuit does not vary. Therefore, the compensation current and the sum of the base currents of the first and the second PNP transistor are determined by the emitter areas of the transistors.

In a further embodiment of the invention an third PNP transistor, whose base is coupled to the junction point and whose emitter is coupled to the voltage source, supplies its collector current to an inverting amplifier via an emitter-base junction of a fourth PNP transistor whose collector is connected to a reference potential, a current which is substantially equal to the sum of the base currents of the first, the second and the third PNP transistor being applied from the output of said inverting amplifier to the junction point.

The output current of the amplifier corresponds to the base current of the first, the second and the third PNP transistor. In order to enable the sum of the base currents caused by the first two PNP transistors to be compensated for in the case of different specimens of integrated circuits comprising the current-mirror arrangement, i.e. different specimens of the current-mirror arrangement having different emitter areas, the emitter area of the third and that of the fourth PNP transistor are in a constant ratio to the emitter area of the first and that of the second PNP transistor respectively. The fourth resistor and the d.c. gain of the amplifier should be selected in such a way that the amplifier supplies a current corresponding to the sum of the base currents of the first, the second and the third transistor.

The value of the fourth resistor may now be selected in such a way that it is substantially equal to twice the value of the first resistor and the d.c. gain of the inverting amplifier may be selected in such a way that it is equal to 3. The base current of the third PNP transistor is then substantially equal to half the sum current formed by the base current of the first and the second PNP transistor.

In another embodiment the inverting amplifier comprises a first NPN transistor whose collector and base are coupled to the base of the fourth PNP transistor and whose emitter is coupled to the reference potential, and a second NPN transistor having an emitter area which is substantially equal to three times the emitter area of the first NPN transistor and having its base coupled to the base of the first NPN transistor, its emitter to the reference potential, and its collector to the junction point. This amplifier is constructed as a simple current-mirror arrangement comprising NPN transistors, which generally have such a high gain that the symmetry errors caused by the base currents are almost negligable.

BRIEF DESCRIPTION OF THE DRAWING

An embodiment of the invention will now be described in more detail, by way of example, with reference to the drawing which illustrates a schematic circuit of an exemplary form of the invention.

DESCRIPTION OF THE PREFERRED EMBODIMENTS

The input current Ye is applied to a junction point 1 which interconnects the compensation circuit 2, the collector of a first PNP transistor 3, the base of a second PNP transistor 4, and one terminal of a resistor 5. The other terminal of the resistor 5 is connected to the base of the transistor 3. The emitter of the transistor 3 is connected to a voltage source Ub via a resistor 6 and the emitter of the transistor 4 is connected to this voltage source via a resistor 7. The output current Ya of the current-mirror arrangement is supplied by the collector of the transistor 4. The resistors 6 and 7 should be selected to produce a voltage drop larger than one third of the base-emitter voltage of the transistor 3 or 4. Suitably, their value is selected so as to obtain a voltage drop equal to half the base-emitter voltage of the transistor 3 or 4. The resistors 6 and 7 ensure that differences between the base-emitter voltages of the transistors 3 and 4 as a result of tolerance spreads do not affect the correct operation of the current-mirror arrangement.

In the compensation circuit 2 a PNP transistor 8 has its base connected to the junction point 1, its emitter to the voltage source Ub via a resistor 9, and its collector to the emitter of a PNP transistor 12. The collector of the transistor 12 is connected to ground and its base is connected to the base and to the collector of an NPN transistor 10. The emitter of this transistor 10 and the emitter of an NPN transistor 11 are connected to ground, the base of the latter transistor being connected to the base of the transistor 10 and its collector being connected to the junction point 1. The transistors 10 and 11 constitute a simple current-mirror arrangement in which only very small negligible symmetry errors occur because the d.c. gain of an NPN transistor is generally very high.

The emitter area of the transistor 8 and that of the transistor 12 are equal to half the emitter area of the transistor 3 and that of the transistor 4 respectively. The emitter area of the transistor 11 is equal to three times the emitter area of the transistor 10. For example, the emitter area of the NPN transistor 10 may be equal to one sixth of the emitter area of the transistor 3 and the emitter area of the NPN transistor 11 may be equal to half that of the transistor 4. The inverting amplifier comprising the NPN transistors 10 and 11 has a d.c. gain factor of 3. The value of the resistor 9 is equal to twice the value of the resistor 6 or the resistor 7.

The current-mirror arrangement should generate an output current which is in a fixed ratio to the input current, for example a ratio equal to unity. The known current-mirror arrangement, i.e. without the resistor 5 and the compensation circuit 2, exhibits a symmetry error caused by the base currents of the transistors 3 and 4. The compensation circuit 2 generates a compensation current which counteracts the sum of the base currents of the transistors 3 and 4. This compensation current is substantially equal to twice the base current of the transistor 8.

Generally, such a current-mirror arrangement is incorporated in an integrated circuit. The emitter areas of the transistors may differ in different specimens of the integrated circuit. The magnitudes of these emitter areas relative to each other do not change, only the absolute magnitude of the emitter area of the transistor can vary. As the d.c. gain of the transistors depends on the emitter area, different specimens of the current-mirror arrangement also exhibit different d.c. gain factors. When the d.c. gain changes the base currents of the transistors 3 and 4 will also change. Since the emitter areas of the transistors 8, 12, 10 and 11 also vary, their d.c. gain and hence the compensation current will also vary. The current-mirror arrangement in accordance with the invention may also be used when the d.c. gain is very small because the symmetry errors occurring in the known current-mirror arrangement are compensated for.

The resistor 5, which has the same value as the resistor 6 or the resistor 7, improves the transfer characteristics of the current-mirror arrangement. Without this resistor 5 an input current pulse produces an output current pulse having a very slow rise time. The resistor 5 thus provides a faster rise time. In a practical embodiment the resistors 5, 6 and 7 are 5 kohms and the resistor 9 is 10 kohms. Practical tests have revealed that the current-mirror arrangement is also largely independent of temperature fluctuations.

What is claimed is:

1. A current-mirror arrangement comprising a first transistor having its emitter coupled to a voltage source terminal and its collector and base coupled to a junction point for the application of an input current, at least a second transistor whose emitter is coupled to the voltage source terminal, whose base is coupled to the base of the first transistor, and whose collector constitutes an output for supplying an output current, and a compensation circuit comprising transistor means supplying a compensation current to the junction point, said compensation circuit transistor means including at least a third transistor having an emitter coupled to said voltage source terminal and a base coupled to the junction point so that the base-emitter circuit of the third transistor is in parallel with the base-emitter circuit of the first transistor, whereby a variation of said input current produces a variation in the sum of the bsse currents of the first, second and third transistors and the compensation circuit delivers a compensation current to the junction point that corresponds to the sum of the base currents of the first, second and third transistors.

2. A current-mirror arrangement as claimed in claim 1, characterized in that the emitter of the first transistor is coupled to the voltage source terminal via a first resistor and the emitter of the second transistor is coupled to said voltage source terminal via a second resistor of substantially the same value as the first resistor.

3. A current-mirror arrangement as claimed in claim 2, characterized in that a third resistor of the same resistance value as the first resistor is connected between the base of the first transistor and the junction point.

4. A current-mirror arrangement as claimed in claim 3, wherein the transistor means comprises a fourth PNP transistor, and the first and second transistors are PNP transistors and the third transistor in the compensation circuit comprises a PNP transistor which supplies its collector current to an inverting amplifier via an emitter-base junction of the fourth PNP transistor whose collector is connected to a reference potential, a compensation current substantially equal to the sum of the base currents of the first, second and third PNP transistors being applied from an output of said inverting amplifier to the junction point.

5. A current-mirror arrangement as claimed in claim 4, wherein the emitter of the third transistor is coupled to the voltage source terminal via a fourth resistor.

6. A current-mirror arrangement as claimed in claim 5, characterized in that the emitter area of the third and that of the fourth PNP transistor are each substantially equal to half the emitter area of the first PNP transistor, in that the value of the fourth resistor is substantially equal to twice the value of the first resistor, and in that the inverting amplifier has a d.c. gain factor of three.

7. A current-mirror arrangement as claimed in claim 6, characterized in that the inverting amplifier comprises a first NPN transistor whose collector and base are coupled to the base of the fourth PNP transistor and whose emitter is coupled to the reference potential, and a second NPN transistor having an emitter area which is substantially equal to three times the emitter area of the first NPN transistor and having its base coupled to the base of the first NPN transistor, its emitter coupled to the reference potential, and its collector coupled to the junction point.

8. A current-mirror arrangement as claimed in claim 1 further comprising a resistor coupling the base of the first transistor to the base of the second transistor and to said junction point.

9. A current-mirror arrangement as claimed in claim 1 wherein the first, second and third transistors are each of a first conductivity type, said third transistor supplying its collector current to an inverting amplifier via an emitter-base junction of a fourth transistor of the first conductivity type, said fourth transistor having a collector coupled to a reference potential, said inverting amplifier having an output which supplies to the junction point a current substantially equal to the sum of the base currents of the first, second and third transistors.

10. A current-mirror arrangement as claimed in claim 9 wherein the emitter of the first transistor and the emitter of the second transistor are coupled to the voltage source terminal via first and second equal value resistors, respectively, a third resistor coupling the base of the first transistor to the base of the second transistor and to said junction point, said first and third resistors having the same resistance value, and wherein the emitter of the third transistor is coupled to the voltage source terminal via a fourth resistor.

11. A current-mirror arrangement as claimed in claim 9 wherein the first through fourth transistors are PNP transistors and the inverting amplifier comprises a first NPN transistor whose collector and base are coupled to the base of the fourth PNP transistor and whose emitter is coupled to the reference potential, and a second NPN transistor having an emitter area which is greater than the emitter area of the first NPN transistor and having its base coupled to the base of the first NPN transistor, its emitter to the reference potential, and its collector to the junction point.

12. A current-mirror arrangement as claimed in claim 1, wherein the base of the first transistor and the base of the second transistor are DC coupled to said junction point.

13. A current-mirror arrangement as claimed in claim 1 characterized in that, the first and the second transistor are both PNP transistors, the transistor means of the compensation circuit comprises further PNP transistors, and the compensation circuit generates a compensation current that depends on the emitter areas of the PNP transistors in the compensation circuit in the same way as the sum of the base currents of the first and second transistors depend on their emitter areas.

14. A current-mirror arrangement comprising a first transistor of a first conductivity type having an emitter coupled to a voltage source terminal and a collector and base coupled to a junction point for the reception of an input current, a second transistor of the first conductivity type having an emitter coupled to the voltage source terminal, a base coupled to the base of the first transistor and a collector that constitutes the output for supplying an output current, and a compensation circuit for supplying a compensation current to the junction point, wherein the compensation circuit comprises a third transistor of the first conductivity type having a base coupled to the junction point, an emitter coupled to the voltage source terminal and a collector coupled to an emitter of a fourth transistor of the first conductivity type, said fourth transistor having a collector coupled to a reference potential and a base coupled to an input of an inverting amplifier having an output coupled to the junction point to supply said compensation current.

15. A current-mirror arrangement as claimed in claim 14, wherein the inverting amplifier comprises a fifth transistor of a second conductivity type having a base and collector coupled to the amplifier input and an emitter coupled to the reference potential, and a sixth transistor of the second conductivity type having a base coupled to the base of the fifth transistor, an emitter coupled to the reference potential and a collector coupled to the output of the inverting amplifier.

16. A current-mirror arrangement as claimed in claim 14, wherein the emitter of the first transistor is coupled to the voltage source terminal via a first resistor, the emitter of the second transistor is coupled to said voltage source terminal via a second resistor and the emitter of the third transistor is coupled to said voltage source terminal via a third resistor.

17. A current-mirror arrangement as claimed in claim 14, wherein the transistors of the first conductivity type are PNP transistors.

18. A currrent-mirror arrangement as claimed in claim 14, further comprising a resistor connected between the base of the first transistor and the junction point.

19. A current-mirror arrangement as claimed in claim 14, wherein the gain of the inverting amplifier is equal to the ratio of the sum of the base currents of the first, second and third transistors to the base current of the third transistor.

* * * * *